US012713603B2

(12) United States Patent
Chung et al.

(10) Patent No.: US 12,713,603 B2
(45) **Date of Patent: *Aug. 18, 2026**

(54) NONVOLATILE MEMORY DEVICE

(71) Applicant: Samsung Electronics Co., Ltd., Suwon-si (KR)

(72) Inventors: Gi Yong Chung, Seoul (KR); Ho Jin Kim, Hwaseong-si (KR); Young-Jin Kwon, Suwon-si (KR); Dong Seog Eun, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 463 days.

This patent is subject to a terminal disclaimer.

(21) Appl. No.: 18/209,983

(22) Filed: Jun. 14, 2023

(65) Prior Publication Data

US 2023/0328989 A1 Oct. 12, 2023

Related U.S. Application Data

(63) Continuation of application No. 17/143,216, filed on Jan. 7, 2021, now Pat. No. 11,716,849.

(30) Foreign Application Priority Data

Apr. 22, 2020 (KR) ........................ 10-2020-0048826

(51) Int. Cl.

| | |
|---|---|
| ***H10B 43/27*** | (2023.01) |
| ***G11C 8/14*** | (2006.01) |
| ***H10B 41/10*** | (2023.01) |
| ***H10B 41/27*** | (2023.01) |
| ***H10B 41/40*** | (2023.01) |
| ***H10B 43/10*** | (2023.01) |
| ***H10B 43/40*** | (2023.01) |

(52) U.S. Cl.

CPC ............... *H10B 43/27* (2023.02); *G11C 8/14* (2013.01); *H10B 41/10* (2023.02); *H10B 41/27* (2023.02); *H10B 41/40* (2023.02); *H10B 43/10* (2023.02); *H10B 43/40* (2023.02)

(58) Field of Classification Search

CPC ...................................................... H10B 43/27

See application file for complete search history.

(56) References Cited

U.S. PATENT DOCUMENTS

| | | | | |
|---|---|---|---|---|
| 9,666,592 | B2 | 5/2017 | Yun et al. | |
| 10,332,908 | B2 | 6/2019 | Lee | |
| 11,716,849 | B2 * | 8/2023 | Chung | H10B 43/40 |
| 2017/0301684 | A1 | 10/2017 | Park et al. | |
| 2019/0035808 | A1 | 1/2019 | Hwang et al. | |

(Continued)

FOREIGN PATENT DOCUMENTS

| | | | |
|---|---|---|---|
| KR | 20090047614 | A | 5/2009 |
| KR | 20180047048 | A | 5/2018 |

(Continued)

*Primary Examiner* — Christopher A Johnson

(74) *Attorney, Agent, or Firm* — Muir Patent Law, PLLC

(57) ABSTRACT

A nonvolatile memory device includes a substrate including a cell array region, a first gate electrode including an opening on the cell array region of the substrate, a plurality of second gate electrodes stacked above the first gate electrode and including convex portions having an outward curve extending toward the substrate, and a word line cutting region cutting the opening and the convex portions.

20 Claims, 17 Drawing Sheets

(56) References Cited

U.S. PATENT DOCUMENTS

| | | | | |
|---|---|---|---|---|
| 2019/0043889 | A1 | 2/2019 | Park et al. | |
| 2019/0148399 | A1 | 5/2019 | Jung et al. | |
| 2019/0312049 | A1 | 10/2019 | Cheon et al. | |
| 2019/0385681 | A1* | 12/2019 | Yun | G11C 16/16 |
| 2020/0091176 | A1 | 3/2020 | Yun et al. | |
| 2022/0328511 | A1 | 10/2022 | Chung et al. | |

FOREIGN PATENT DOCUMENTS

| | | | |
|---|---|---|---|
| KR | 10-2020-0031442 | A | 3/2020 |
| KR | 10-2019-0128811 | A | 12/2023 |
| KR | 10-2019-0117954 | A | 2/2024 |

* cited by examiner

CS1
CS2
CS3
CS4
CH1
CH2
CH3
CH4
TR
161
162
163
164
165
166
171
151
143
142
141
132
131
122
121
115
114
113
112
100
A'
A
130a
120a
X
Y
Z 171
151
152
143
142
141
132
131
122
121
115
110
100
A'
A
CS1
CS2
CS3
CS4
CH1
CH2
CH3
CH4
161
162
163
164
165
166
WLC
TR
130b
120a
Z
X
Y

NONVOLATILE MEMORY DEVICE

CROSS-REFERENCE TO RELATED APPLICATION

This application is a continuation of and claims priority to U.S. patent application Ser. No. 17/143,216 filed on Jan. 7, 2021, which claims priority from Korean Patent Application No. 10-2020-0048826 filed on Apr. 22, 2020 in the Korean Intellectual Property Office, and all the benefits accruing therefrom under 35 U.S.C. 119, the contents of which in their entirety are herein incorporated by reference.

BACKGROUND

1. Technical Field

Embodiments relate to a nonvolatile memory device.

2. Description of the Related Art

A volatile memory device is a memory device which loses its stored data when power supply is cut off. The volatile memory device may be a static RAM (SRAM), a dynamic RAM (DRAM), a synchronous DRAM (SDRAM), or the like. A nonvolatile memory device is a memory device which retains its stored data even when power supply is cut off. The nonvolatile memory device may be a flash memory device, a read only memory (ROM), a programmable ROM (PROM), an electrically programmable ROM (EPROM), an electrically erasable and programmable ROM (EEPROM), a resistive memory device (e.g., a phase-change RAM (PRAM), a ferroelectric RAM (FRAM), and a resistive RAM (RRAM)), or the like.

In order to satisfy consumer demands for superior performance and inexpensive prices, the integration density of nonvolatile memory devices is increasing. However, in the case of a two-dimensional or a planar memory device, the integration density is determined by the area occupied by a unit memory cell. Therefore, recently, a three-dimensional memory device in which unit memory cells are vertically arranged has been developed.

SUMMARY

Aspects of the present disclosure provide a nonvolatile memory device with improved product reliability.

Embodiments are directed to a nonvolatile memory device including a substrate including a cell array region, a first gate electrode including an opening on the cell array region of the substrate, a plurality of second gate electrodes stacked above the first gate electrode and including convex portions having an outward curve extending toward the substrate, and a word line cutting region cutting the opening and the convex portions.

Embodiments are also directed to a nonvolatile memory device including a plurality of gate electrodes extending in a first direction on a substrate and stacked in a second direction perpendicular to the first direction, a first channel structure passing through the plurality of gate electrodes, and a second channel structure passing through the plurality of gate electrodes and spaced apart from the first channel structure by a first length in the first direction, wherein at least a subset of the plurality of gate electrodes each includes a convex portion having an outward curve extending toward the substrate and having a second length in the first direction, the convex portion is formed between the first channel structure and the second channel structure, and the first length is greater than the second length.

Embodiments are also directed to a nonvolatile memory device including a substrate including a cell array region and an extension region, a first gate electrode including a first opening above the cell array region on the substrate and a second opening above the extension region on the substrate, a plurality of second gate electrodes stacked on the first gate electrode and each including a first convex portion corresponding to the first opening and having an outward curve extending toward the substrate and a second convex portion corresponding to the second opening and having an outward curve extending toward the substrate, a channel structure passing through the first gate electrode and the plurality of second gate electrodes on the cell array region, and a word line cutting region cutting the first opening and the first convex portions, wherein as a distance between the substrate and the first convex portions and the second convex portions decreases, width of the first convex portions and the second convex portions increases.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

Features will become apparent to those of skill in the art by describing in detail exemplary embodiments thereof with reference to the attached drawings, in which:

FIGS. 8 to 16 illustrate diagrams illustrating the intermediate steps of a method of manufacturing a nonvolatile memory device according to some embodiments of the present disclosure.

DETAILED DESCRIPTION OF THE EMBODIMENTS

Figure 1:
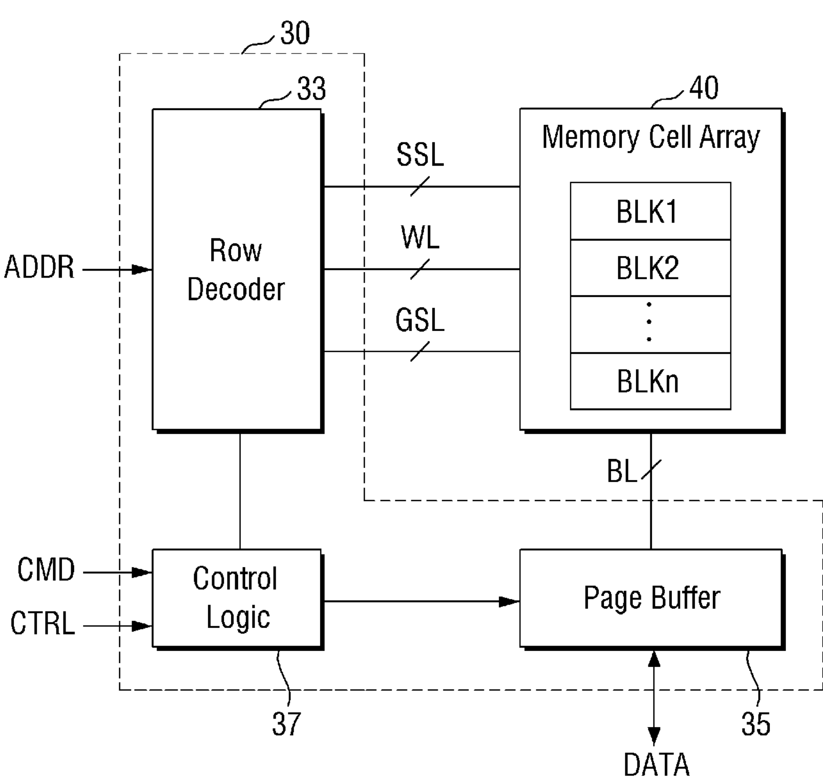
FIG. 1 illustrates a block diagram illustrating a nonvolatile memory device according to some embodiments of the present disclosure.

FIG. 1 is a block diagram illustrating a nonvolatile memory device according to some embodiments of the present disclosure.

Referring to FIG. 1, a nonvolatile memory device according to some embodiments of the present disclosure may include a memory cell array 40 and a peripheral circuit 30.

The memory cell array 40 may include a plurality of memory blocks BLK1 to BLKn. Each of the memory blocks BLK1 to BLKn may include a plurality of memory cells. The memory blocks BLK1 to BLKn may be connected to the peripheral circuit 30 through bit lines BL, word lines WL, at least one of string select lines SSL, and at least one of ground select lines GSL.

Specifically, the memory blocks BLK1 to BLKn may be connected to a row decoder 33 through the word lines WL, at least one of the string select lines SSL, and at least one of the ground select lines GSL. Further, the memory blocks BLK1 to BLKn may be connected to a page buffer 35 through the bit lines BL.

The peripheral circuit 30 may receive an address ADDR, a command CMD, and a control signal CTRL from the outside of the nonvolatile memory device, and may transmit and receive data DATA to and from an external device of the nonvolatile memory device. The peripheral circuit 30 may include a control logic (e.g., a logic circuit) 37, the row decoder 33 and the page buffer 35.

Although not shown, the peripheral circuit 30 may further include various sub-circuits such as an input/output circuit, a voltage generation circuit for generating various voltages required for the operation of the nonvolatile memory device, and an error correction circuit for correcting an error of data DATA read from the memory cell array 40.

The control logic 37 may be connected to the row decoder 33, the input/output circuit and the voltage generation circuit. The control logic 37 may control an overall operation of the nonvolatile memory device. The control logic 37 may generate various internal control signals used in the nonvolatile memory device in response to the control signal CTRL. For example, the control logic 37 may adjust a voltage level provided to the word lines WL and the bit lines BL during the execution of a memory operation such as a program operation or an erase operation.

The row decoder 33 may select at least one of the plurality of memory blocks BLK1 to BLKn in response to the address ADDR. Further, the row decoder 33 may select at least one of the word lines WL, at least one of the string select lines SSL and at least one of the ground select lines GSL for the selected at least one of the memory blocks BLK1 to BLKn. The row decoder 33 may transmit a voltage for performing a memory operation to the word lines WL of the selected at least one of the memory blocks BLK1 to BLKn.

The page buffer 35 may be connected to the memory cell array 40 through the bit lines BL. The page buffer 35 may operate as a writer driver or a sense amplifier. Specifically, during the program operation, the page buffer 35 may operate as a write driver to apply, to the bit lines BL, a voltage corresponding to the data DATA intended to be stored in the memory cell array 40. On the other hand, during the read operation, the page buffer 35 may operate as a sense amplifier to sense the data DATA stored in the memory cell array 40.

Figure 2:
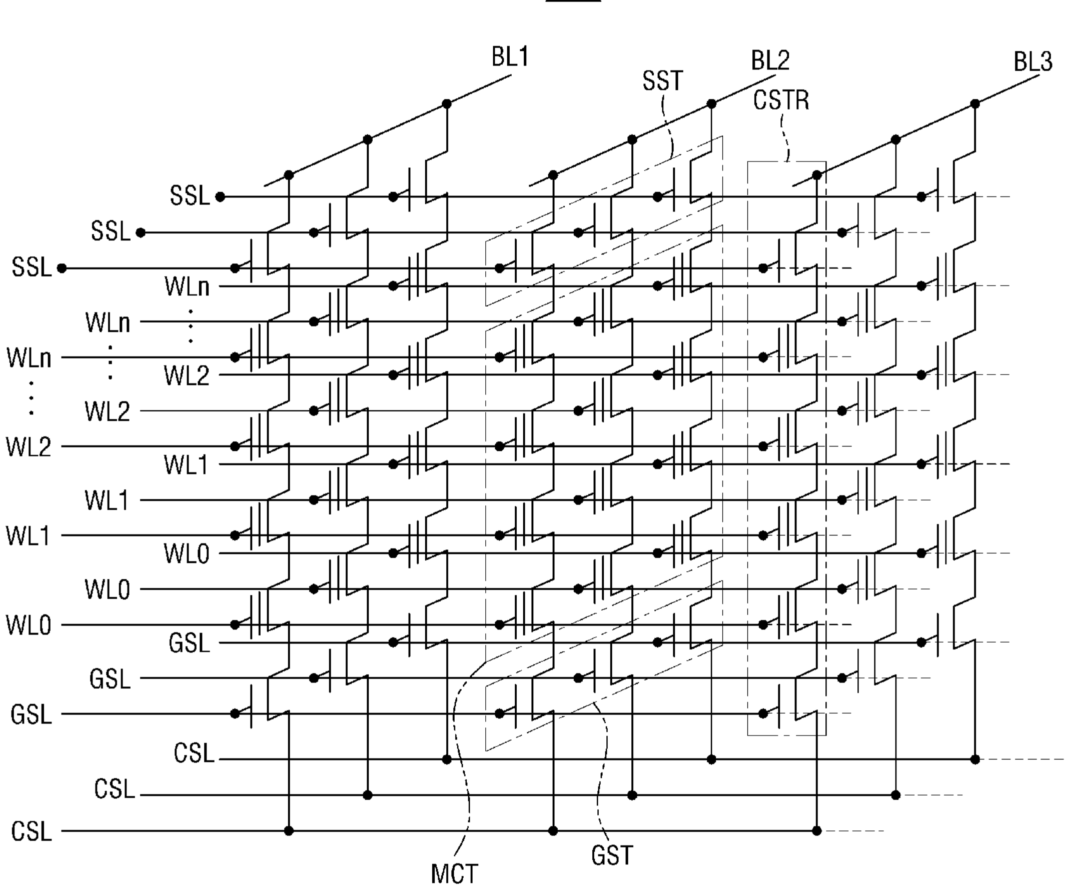
FIG. 2 illustrates an exemplary circuit diagram describing one memory block among memory blocks included in a memory cell array of FIG. 1.
Figure 2:
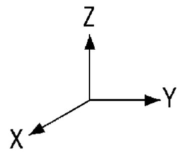

FIG. 2 is an exemplary circuit diagram describing one memory block among memory blocks included in the memory cell array of FIG. 1.

Referring to FIG. 2, a memory block according to some embodiments of the present disclosure may include common source lines CSL, a plurality of bit lines BL, and a plurality of cell strings CSTR.

The plurality of bit lines BL1 to BL3 may be arranged two-dimensionally. For example, the plurality of bit lines BL1 to BL3 may be spaced apart from each other and extend in a first direction X, respectively. The plurality of cell strings CSTR may be connected in parallel to each of the bit lines BL. The cell strings CSTR may be commonly connected to the common source lines CSL. That is, the plurality of cell strings CSTR may be disposed between the bit lines BL and the common source lines CSL.

In some embodiments, the common source lines CSL may be arranged two-dimensionally. For example, the common source lines CSL may be spaced apart from each other and extend in a second direction Y, respectively. The same voltage may be applied to the common source lines CSL. Alternatively, different voltages may be applied to the common source lines CSL to be controlled separately.

Each of the cell strings CSTR may include a ground select transistor GST connected to the common source line CSL, a string select transistor SST connected to each of the bit lines BL1 to BL3, and a plurality of memory cell transistors MCT disposed between the ground select transistor GST and the string select transistor SST. Each of the memory cell transistors MCT may include a data storage element. The ground select transistor GST, the string select transistor SST, and the memory cell transistors MCT may be connected in series.

Although not shown in this drawing, each cell string CSTR may further include a dummy cell connected between the string select transistor SST and the memory cell. In addition, the dummy cell may also be connected between the ground select transistor GST and the memory cell.

The common source line CSL may be commonly connected to the sources of the ground select transistors GST. In addition, a plurality of gate electrodes (e.g., the ground select line GSL, the plurality of word lines WL1 to WLn and the string select line SSL) may be disposed between the common source line CSL and each of the bit lines BL1 to BL3. The ground select line GSL may be used as a gate electrode of the ground select transistor GST. The plurality of word lines WL1 to WLn may be used as gate electrodes of the memory cell transistors MCT. The string select line SSL may be used as a gate electrode of the string select transistor SST.

Figure 3:
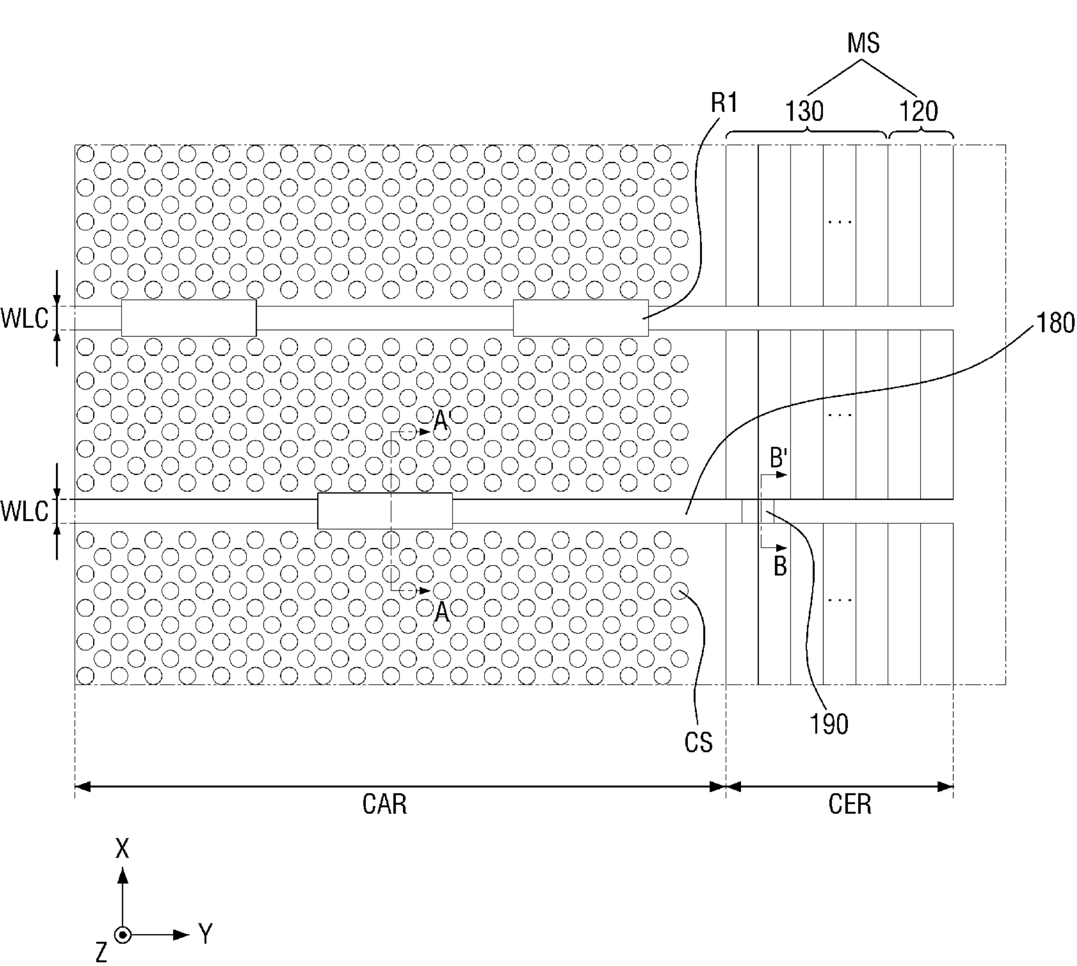
FIG. 3 illustrates a layout diagram of a nonvolatile memory device according to some embodiments of the present disclosure.
Figure 4:
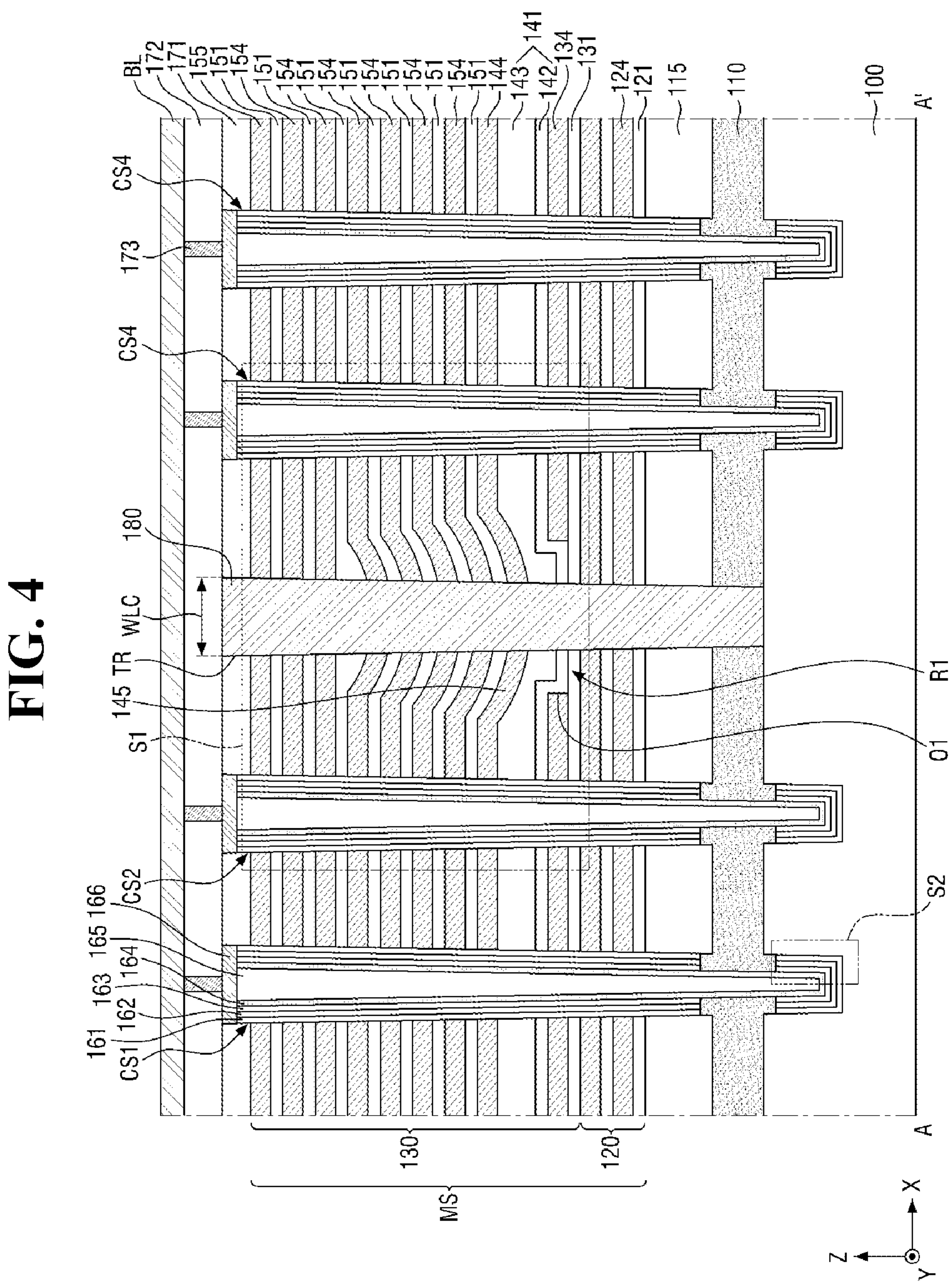
FIG. 4 illustrates a cross-sectional view taken along line A-A' of FIG. 3.
Figure 5:
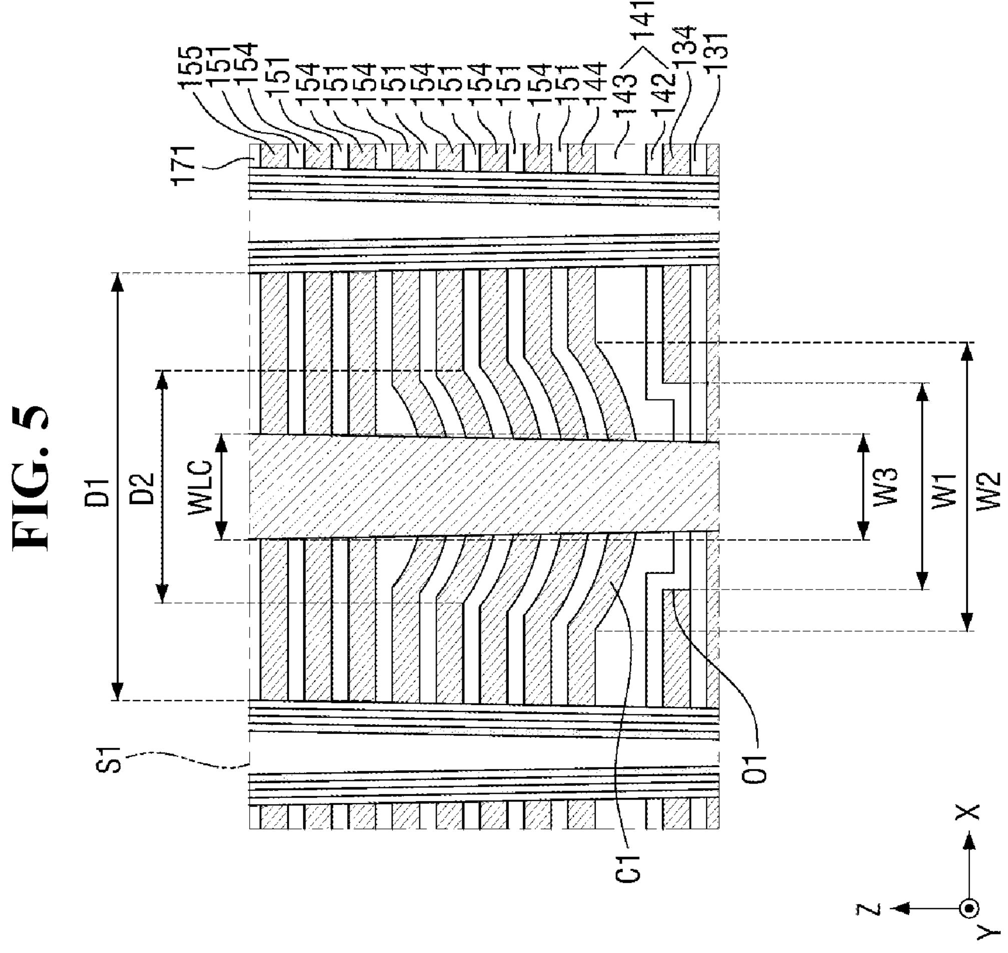
FIG. 5 illustrates an enlarged view of portion S1 of FIG. 4.
Figure 6:
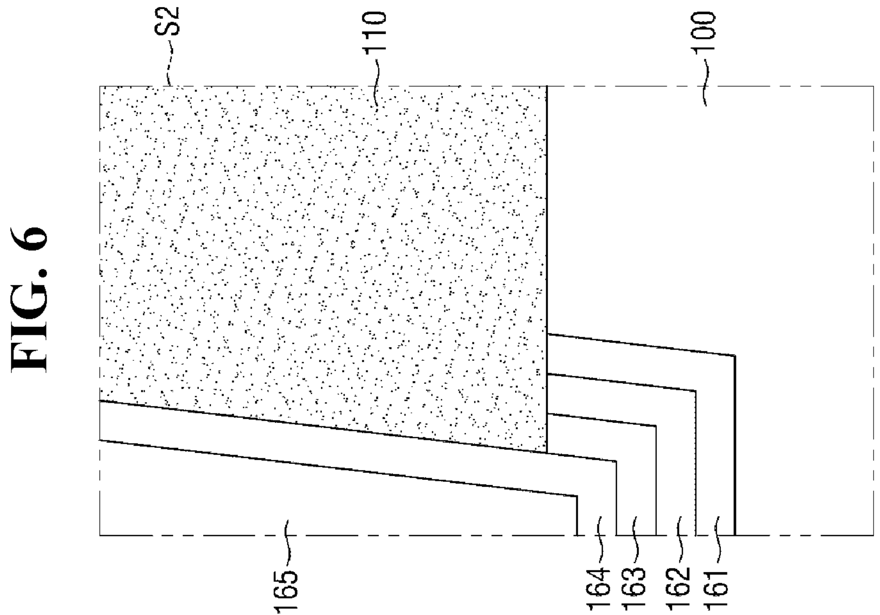
FIG. 6 illustrates an enlarged view of portion S2 of FIG. 4.

FIG. 3 is a layout diagram of a nonvolatile memory device according to some embodiments of the present disclosure. FIG. 4 is a cross-sectional view taken along line A-A' of FIG. 3. FIG. 5 is an enlarged view of portion S1 of FIG. 4. FIG. 6 is an enlarged view of portion S2 of FIG. 4.

Referring to FIGS. 3 to 6, a nonvolatile memory device according to some embodiments of the present disclosure may include a substrate 100, a common source plate 110, a supporter film 115, a mold structure MS, and a cutting structure 180, a plurality of channel structures CS1 to CS4, and a plurality of bit lines BL.

The substrate 100 may be, for example, a semiconductor substrate such as a silicon substrate, a germanium substrate, or a silicon-germanium substrate. Alternatively, the substrate 100 may be a silicon-on-insulator (SOI) substrate or a germanium-on-insulator (GOI) substrate.

The substrate 100 may include a cell array region CAR and an extension region CER.

A memory cell array (40 in FIG. 1) including a plurality of memory cells may be formed in the cell array region CAR. The memory cell array may include a plurality of memory cells, and a plurality of bit lines and a plurality of word lines which are electrically connected to each of the memory cells. For example, the mold structure MS, the plurality of channel structures CS, a plurality of cutting structures 180, and the bit line BL may be formed in the cell array region CAR.

The extension region CER may be disposed around the cell array region CAR. A plurality of gate electrodes 124, 134, 144, and 154 may be stacked in a stepped shape in the extension region CER. The plurality of gate electrodes 124, 134, 144, and 154 may be stacked in a third direction Z.

Further, memory cell contacts (not shown) connected to each of the gate electrodes 124, 134, 144, and 154 may be formed in the extension region CER. For example, the memory cell contacts may be formed to pass through a fourth insulating film 171 and a fifth insulating film 172 to be connected to each of the gate electrodes 124, 134, 144, and 154.

The common source plate 110 may be disposed on the substrate 100. The common source plate 110 may be formed in each of the cell array region CAR and the extension region CER. The common source plate 110 may serve as the common source line CSL of FIG. 2.

The common source plate 110 may be formed of at least one of a conductive semiconductor film, a metal silicide film, or a metal film. When the common source plate 110 is formed of a conductive semiconductor film, the common source plate 110 may be formed of, for example, at least one of silicon (Si), germanium (Ge), silicon germanium (SiGe), gallium arsenide (GaAs), indium gallium arsenic (InGaAs), aluminum gallium arsenide (AlGaAs), or a combination thereof. The common source plate 110 may have a crystal structure including at least one selected from monocrystal, amorphous, and polycrystal structures. The common source plate 110 may include at least one of p-type impurities, n-type impurities, and carbon included in the semiconductor film.

The supporter film 115 may be formed on the common source plate 110. The supporter film 115 may be formed in each of the cell array region CAR and the extension region CER. The supporter film 115 may be disposed between the common source plate 110 and the mold structure MS.

For example, the supporter film 115 may be formed of a semiconductor material such as silicon (Si), germanium (Ge), or a mixture thereof. The mold structure MS may be formed on the substrate 100. The mold structure MS may be formed on the supporter film 115. The mold structure MS may include a first stacked structure 120 and a second stacked structure 130.

The first stacked structure 120 may include a plurality of sub-insulating films 121 and a plurality of sub-gate electrodes 124, which are alternately stacked on the substrate 100. For example, each of the sub-insulating films 121 and each of the sub-gate electrodes 124 may be in form of a layered structure extending in the first direction X and a second direction Y. The sub-insulating films 121 and the sub-gate electrodes 124 may be alternately stacked in the third direction Z intersecting (e.g., perpendicular to) the top surface of the substrate 100.

Although two sub-insulating films 121 and two sub-gate electrodes 124 are illustrated in this drawing, the number of the sub-insulating films 121 and the sub-gate electrodes 124 is not limited thereto.

The second stacked structure 130 may include a plurality of insulating films 131, 141, and 151 and a plurality of gate electrodes 134, 144, 154, and 155, which are alternately stacked on the first stacked structure 120. For example, each of the insulating films 131, 141, and 151 and each of the gate electrodes 134, 144, 154, and 155 may be in form of a layered structure extending in the first direction X and the second direction Y. The first insulating film 131, the second insulating film 141, the third insulating film 151, and the first to fourth gate electrodes 134, 144, 154, and 155 may be alternately stacked in the third direction Z intersecting (e.g., perpendicular to) the top surface of the substrate 100.

The plurality of gate electrodes 134, 144, 154, and 155 may include the first gate electrode 134, the second gate electrode 144, the plurality of third gate electrodes 154, and the fourth gate electrode 155, which are stacked on the first stacked structure 120 in that order.

The first gate electrode 134 may be disposed on the first stacked structure 120. The first gate electrode 134 may be disposed at the lowest level of the plurality of gate electrodes 134, 144, 154, and 155. The second gate electrode 144 may be disposed above the first gate electrode 134. The second gate electrode 144 may be a gate electrode closest to the first gate electrode 134 among the plurality of gate electrodes 134, 144, 154, and 155 included in the second stacked structure 130. The third gate electrode 154 may be disposed above the second gate electrode 144. The fourth gate electrode 155 may be disposed above the third gate electrode 154. The fourth gate electrode 155 may be disposed at the uppermost level of the plurality of gate electrodes 134, 144, 154, and 155. Accordingly, with respect to the third direction Z, the sub-first gate electrodes 124 and the plurality of gate electrodes 134, 144, 154, and 155 may be stacked above the substrate 100. Additionally, with respect to the third direction Z, the plurality of gate electrodes 134, 144, 154, and 155 may be stacked above the sub-gate electrodes 124. Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

For example, the first gate electrode 134 may be the ground select line GSL, the second gate electrode 144 and the plurality of third gate electrodes 154 may be the word lines, and the fourth gate electrode 155 may be the string select line SSL.

The first gate electrode 134 may be separated in the first direction X. The first gate electrode 134 may include portions separated by a third length in the first direction X.

In other words, the first gate electrode 134 may include a cut region R1. The first gate electrode 134 may include a first opening O1. The cut region R1 may be defined by the first opening O1. The first opening O1 may expose at least a portion of the top surface of the first insulating film 131. The first opening O1 may have a first width W1 in the first direction X.

The first gate electrode 134 may be separated in the first direction X around the cutting structure 180 to be described later. For example, the cutting structure 180 may be disposed at the center of the first opening O1. That is, the distance from one side of the cutting structure 180 to one side (a side in the same direction as the one side of the cutting structure 180) of the first opening O1 is substantially the same as the distance from the other side of the cutting structure 180 to the other side (a side in the same direction as the other side of the cutting structure 180) of the first opening O1.

The second insulating film 141 may be disposed on and in contact with (i.e., touching) the first gate electrode 134 and the first opening O1. The second insulating film 141 may be disposed on and in contact with the first insulating film 131 whose top surface has been exposed by the first opening O1. The second insulating film 141 may be disposed between and in contact with the first gate electrode 134 and the second gate electrode 144. The second insulating film 141 may include a first interlayer insulating film 142 and a second interlayer insulating film 143.

The first interlayer insulating film 142 may be disposed along and in contact with the profiles of the first gate electrode 134 and the first opening O1. The first interlayer insulating film 142 may be formed conformally.

The second interlayer insulating film 143 may be disposed on and in contact with the first interlayer insulating film 142. The top surface of the second interlayer insulating film 143 may include a flat portion and a convex portion protruding toward the substrate 100. The second interlayer insulating film 143 may include the convex portion toward the substrate 100, on the first opening O1. That is, the second interlayer insulating film 143 may include a portion rounded toward the substrate 100, on the first opening O1. The rounded portion may have a gentle shape without being sharp.

The first interlayer insulating film 142 and the second interlayer insulating film 143 may be formed of the same material. For example, the first interlayer insulating film 142 and the second interlayer insulating film 143 may include or may be tetraethyl orthosilicate (TEOS).

The second gate electrode 144 may be disposed on the second insulating film 141. The bottom surface of the second gate electrode 144 may contact the top surface of the second insulating film 141. The bottom surface of the second gate electrode 144 may have the same shape as the top surface of the second insulating film 141. The top surface of the second gate electrode 144 may have a flat portion and a first convex portion C1 protruding toward the substrate 100. That is, the distance from the substrate 100 to the first convex portion C1 in the third direction Z may be smaller than the distance from the substrate 100 to the flat portion of the second gate electrode 144 in the third direction Z.

The first convex portion C1 may be disposed above the first opening O1. The first convex portion C1 may be disposed at a position corresponding to the first opening O1. The first convex portion C1 may be rounded toward the substrate 100. That is, the first convex portion C1 may have an outward curve that extends toward the substrate 100. The first convex portion C1 may have a gentle shape without being sharp. That is, the distance from the substrate 100 to the first convex portion C1 in the third direction Z may become smaller and then larger as it goes from one side of the first convex portion C1 to the other side thereof, that is, as it goes in the first direction X.

The first convex portion C1 may have a second width W2 in the first direction X. The second width W2 may be greater than the first width W1 of the first opening O1 in the first direction X. The first convex portion C1 may be disposed above the center of the first opening O1. For example, the distance from one side of the first convex portion C1 to one side of the first opening O1 may be substantially the same as the distance from the other side of the first convex portion C1 to the other side of the first opening O1.

The plurality of third gate electrodes 154 and the fourth gate electrode 155 may be disposed above the second gate electrode 144. A subset of the third gate electrodes 154 may each include, above the first opening O1, a convex portion protruding toward the substrate 100 at a position corresponding to the first opening O1 and the first convex portion C1.

In relation to each other, the first convex portion C1 of the second gate electrode and the convex portions of the subset of third gate electrodes 154 may increase in width in the first direction X as the electrodes approach the substrate 100 in the third direction Z. That is, as the electrodes (i.e., the second gate electrode 144 and the subset of third gate electrodes 154) approach the substrate 100, the width in the first direction X of the respective convex portions of the electrodes becomes larger.

As illustrated, for example, in FIG. 4, a plurality of layers of third insulating film may be included in the mold structure MS. For example, a layer of third insulating film 151 may be disposed on and in contact with the second gate electrode 144. A layer of third insulating film 151 may be interposed between and in contact with adjacent third gate electrodes 154. A layer of third insulating film 151 may be disposed between and in contact with the third gate electrode 154 and the fourth gate electrode 155. The third insulating film 151 may also have, above the first opening O1, a convex portion protruding toward the substrate 100 at a position corresponding to the first convex portion C1.

The sub-insulating film 121, the first insulating film 131, and the third insulating film 151 may be an insulating material. For example, the sub-insulating film 121, the first insulating film 131, and the third insulating film 151 may be formed of silicon oxide, but are not limited thereto. Alternatively, the sub-insulating film 121, the first insulating film 131, and the third insulating film 151 may be formed of the same material as the second insulating film 141. The sub-insulating film 121, the first insulating film 131, and the third insulating film 151 may include silicon oxide or TEOS, but are not limited thereto.

The sub-gate electrode 124 and the first to fourth gate electrodes 134, 144, 154, and 155 may be a conductive material. For example, the sub-gate electrode 124 and the first to fourth gate electrodes 134, 144, 154, and 155 may include a metal such as tungsten (W), cobalt (Co), and nickel (Ni), or a semiconductor material such as silicon, but are not limited thereto.

The fourth insulating film 171 may be disposed on the mold structure MS. The fourth insulating film 171 may include, for example, at least one of a low dielectric constant material, an oxide film, a nitride film, or an oxynitride film. Alternatively, the fourth insulating film 171 may be formed of the same material as the second insulating film 141. The common source plate 110, a supporter film 115, the mold structure MS, and the fourth insulating film 171 may be cut by a word line cutting region WLC.

Specifically, the common source plate 110, the supporter film 115, the first stacked structure 120, and the second stacked structure 130 on the first opening O1 and the first convex portion C1 may be cut by the word line cutting region WLC. The word line cutting region WLC may extend in a direction intersecting the bit line BL. For example, the word line cutting region WLC may extend in the second direction Y to cut the common source plate 110, the supporter film 115, and the mold structure MS. Accordingly, the plurality of sub-gate electrodes 124 and the plurality of gate electrodes 134, 144, 154, and 155 may be cut by the word line cutting region WLC.

The word line cutting region WLC may be defined by a trench TR. The trench TR may be formed between the second channel structure CS2 and the third channel structure CS3, in the cell array region CAR. The trench TR may be spaced apart from the second channel structure CS2 and the third channel structure CS3 in the first direction X. The trench TR may extend in the second direction Y. A sidewall of the trench TR may be defined by sidewalls of the mold structure MS, the supporter film 115, and the common source plate 110.

The word line cutting region WLC may have a third width W3 in the first direction X. For example, the third width W3 may be smaller than the first width W1 of the first opening O1 in the first direction X. Further, for example, the third width W3 may be smaller than the second width W2 of the first convex portion C1

Since the respective convex portions of the electrodes become larger in width in the first direction X as the electrodes approach the substrate 100, the width of one or more convex portions in the first direction X located at an increased distance from the substrate in the third direction Z, may be smaller than the third width W3. That is, some of the plurality of third gate electrodes 154 and the fourth gate electrode 155 may not include a convex portion, due to the word line cutting region WLC.

The third width W3 of the word line cutting region WLC in the first direction X may be narrowed as it approaches the substrate 100. This may be due to the characteristics of an etching process for forming the word line cutting region WLC.

The cutting structure 180 may be formed in the trench TR. The cutting structure 180 may be arranged to fill the trench TR. The cutting structure 180 may be in contact with each of the common source plate 110, the supporter film 115, and the mold structure MS.

The cutting structure 180 may be formed of, for example, at least one of silicon oxide, silicon nitride, silicon oxynitride, and a low dielectric constant material. The low dielectric constant material may be, for example, fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), tonen silazene (TOSZ), fluoride silicate glass (FSG), polyimide nanofoams such as polypropylene oxide, carbon doped silicon oxide (CDO), organo silicate glass (OSG), SiLK, amorphous fluorinated carbon, silica aerogels, silica xerogels, mesoporous silica, or a combination thereof, but is not limited thereto.

The plurality of channel structures CS1 to CS4 may be arranged in a zigzag form. For example, as shown in FIG. 3, the plurality of channel structures CS1 to CS4 may be alternately arranged in the first direction X and the second direction Y. Accordingly, the integration density of the nonvolatile memory device may be improved.

The plurality of channel structures CS1 to CS4 may pass through the substrate 100, the common source plate 110, the supporter film 115, the mold structure MS, and the fourth insulating film 171. The plurality of channel structures CS1 to CS4 may pass through the common source plate 110 to be connected to the substrate 100. For example, as shown in FIG. 4, the channel structures CS1 to CS4 may pass through the common source plate 110 and be embedded in the substrate 100. The plurality of channel structures CS1 to CS4 may extend in a direction intersecting the plurality of sub-gate electrodes 124 and the plurality of gate electrodes 134, 144, 154, and 155.

For example, each of the channel structures CS1 to CS4 may have a pillar shape (e.g., a cylindrical shape) extending in the third direction Z. In this drawing, each of the channel structures CS1 to CS4 is shown as having a cup shape, but is not limited thereto, and each of the channel structures CS1 to CS4 may have various shapes such as a rectangular tube shape or the like.

Each of the channel structures CS1 to CS4 may include a blocking insulating film 161, a charge storage film 162, a tunnel insulating film 163, a channel film 164, and a filling pattern 165. The tunnel insulating film 163, the charge storage film 162, and the blocking insulating film 161 may be sequentially disposed on the channel film 164. The blocking insulating film 161, the charge storage film 162, the tunnel insulating film 163, and the channel film 164 may be sequentially stacked along the sidewall and bottom surface of each of channel holes CH1 to CH4. The blocking insulating film 161, the charge storage film 162, and the tunnel insulating film 163 are merely exemplary, and are not limited thereto.

The blocking insulating film 161, the charge storage film 162, and the tunnel insulating film 163 may each be separated at the lower portion of the sidewall of each of the channel structures CS1 to CS4. The separated blocking insulating film 161, charge storage film 162, and tunnel insulating film 163 may expose a portion of the sidewall of each of the channel structures CS1 to CS4. The common source plate 110 may be disposed between the separated blocking insulating film 161, charge storage film 162, and tunnel insulating film 163. That is, the blocking insulating film 161, the charge storage film 162, and the tunnel insulating film 163 may each be separated by the common source plate 110.

The channel film 164 may serve as a channel region. The channel film 164 may provide electric charges to be trapped or released by the tunnel insulating film 163. The channel film 164 may be, for example, a semiconductor material such as monocrystalline silicon, polycrystalline silicon, organic semiconductor material, and carbon nanostructure, but is not limited thereto.

The tunnel insulating film 163 may allow, for example, electric charges to flow between the channel film 164 and the charge storage film 162. The tunnel insulating film 163 may be and/or include, for example, silicon oxide or a high dielectric constant material (e.g., aluminum oxide ($Al_2O_3$) or hafnium oxide ($HfO_2$)) having a higher dielectric constant than silicon oxide.

The charge storage film 162 may store, for example, the electric charges that have passed through the tunnel insulating film 163, between the blocking insulating film 161 and the tunnel insulating film 163. The charge storage film 162 may be and/or include, for example, silicon nitride.

The blocking insulating film 161 may prevent, for example, the electric charges trapped in the charge storage film 162 from being discharged to the gate electrodes 124, 134, 144, 154 and 155. The blocking insulating film 161 may be and/or include, for example, silicon oxide or a high dielectric constant material (e.g., aluminum oxide ($Al_2O_3$) or hafnium oxide ($HfO_2$)) having a higher dielectric constant than silicon oxide.

The filling pattern 165 may be disposed on the channel film 164 to fill the inside of each of the channel structures CS1 to CS4. The filling pattern 165 may be, for example, an insulating material, and may be formed of at least one of silicon oxide, silicon oxynitride, and a low dielectric constant material, but is not limited thereto.

A channel pad 166 may be formed to be connected to a top portion of the channel film 164. The channel pad 166 may be formed, for example, in the fourth insulating film 171 formed on the mold structure MS. The top surface of the channel pad 166 may be formed on the same plane as each of the top surface of the channel film 164 and the top surface of the tunnel insulating film 163. However, the present invention is not limited thereto. That is, in some other embodiments, the channel pad 166 may contact the sidewall of each of the first to fourth channel holes CH1 to CH4. The channel pad 166 may serve as a bit line contact.

The second channel structure CS2 and the third channel structure CS3 adjacent to the word line cutting region WLC may be spaced apart by a first length D1 in the first direction X. The first convex portion C1 may have a second length D2 in the first direction X between the second channel structure CS2 and the third channel structure CS3. The second length D2 may be smaller than the first length D1.

That is, the second channel structure CS2 and the third channel structure CS3 may not be disposed on the first convex portion C1 included in the second to fourth gate electrodes 144, 154, and 155. Therefore, the plurality of channel structures CS1 to CS4 may be spaced apart from the first convex portion C1 without overlapping therewith.

Although the second to fourth gate electrodes 144, 154, and 155 include the first convex portion C1 due to the cut region R1 of the first gate electrode 134, the channel structures CS1 to CS4 are not formed on the first convex portion C1. Accordingly, deterioration of the gate electrodes 144, 154, and 155 can be prevented or reduced, and the nonvolatile memory device with improved product reliability can be provided.

The bit line BL may be disposed on the fourth insulating film 171. The bit line BL may extend in the first direction X. The bit line BL may be electrically connected to the channel pad 166 by a bit line contact 173 penetrating the fifth insulating film 172.

Figure 7:
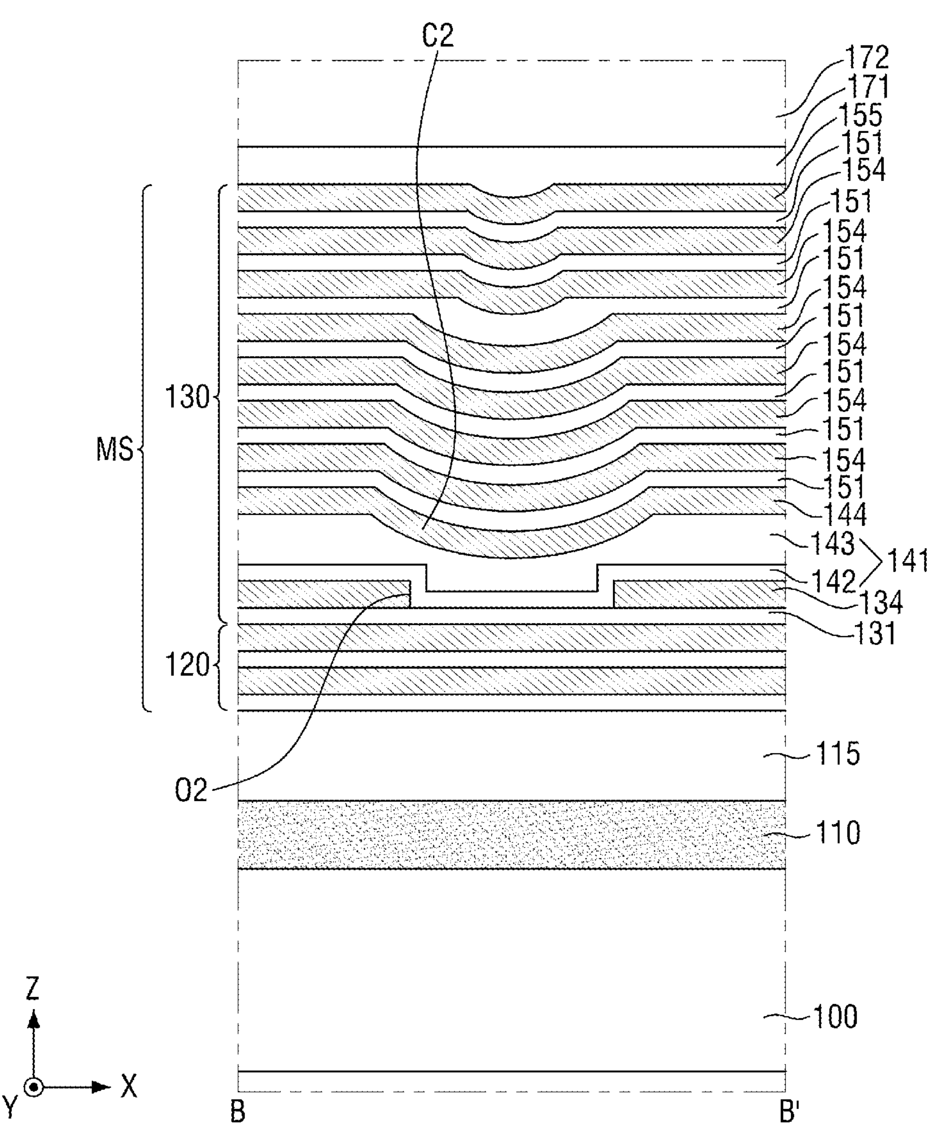
FIG. 7 illustrates a cross-sectional view taken along line B-B' of FIG. 3.

FIG. 7 is a cross-sectional view taken along line B-B' of FIG. 3.

Referring to FIGS. 3 and 7, the extension region CER may include a connection pattern 190. The plurality of sub-gate electrodes 124 and the second to fourth gate electrodes 144, 154, and 155 cut by the word line cutting region WLC may be connected by the connection pattern 190.

The first gate electrode 134 may include a second opening O2. The second opening O2 may expose at least a portion of the top surface of the first insulating film 131. The first gate electrode 134 may be separated in the first direction X by the second opening O2.

The second to fourth gate electrodes 144, 154, and 155 may include a second convex portion C2 protruding toward the substrate 100. The second convex portion C2 may be disposed on the second opening O2. The second convex portion C2 may have a larger width in the first direction X as it approaches the substrate 100 in the third direction Z.

FIGS. 8 to 16 are diagrams illustrating the intermediate steps of a method of manufacturing a nonvolatile memory device according to some embodiments of the present disclosure.

Figure 8:
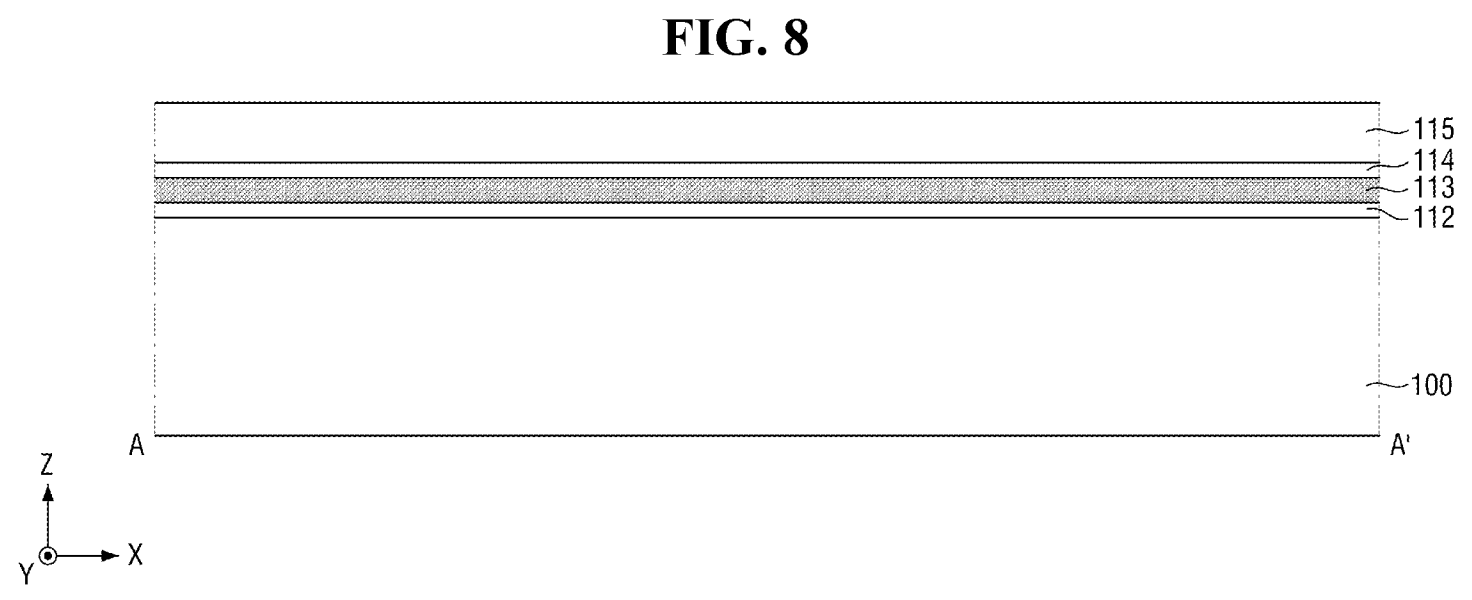

Referring to FIG. 8, a first film 112, a second film 113, a third film 114, and the supporter film 115 may be sequentially formed on the substrate 100.

The first film 112 may be, for example, silicon oxide. The second film 113 may e, for example, silicon nitride. The third film 114 may be, for example, the same material as the first film 112. The third film 114 may be, for example, silicon oxide.

Figure 9:
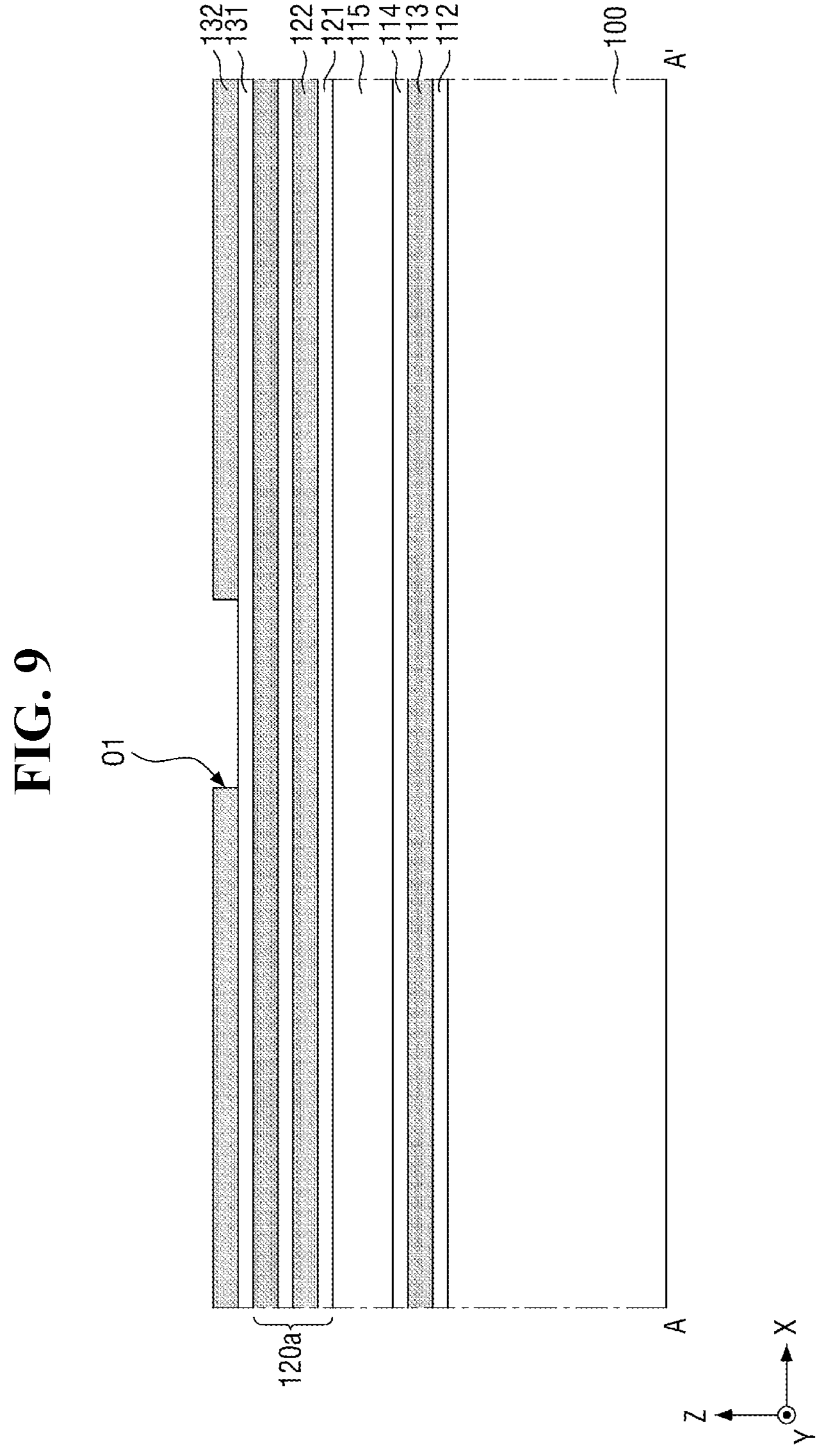

Referring to FIG. 9, a first pre-stacked structure 120*a* in which the sub-insulating film 121 and a sub-sacrificial film 122 are alternately stacked may be formed on the supporter film 115. The sub-sacrificial film 122 may be, for example, silicon nitride (SiN).

The first insulating film 131 may be formed on the first pre-stacked structure 120*a*. A first sacrificial film 132 may be formed on the first insulating film 131. The first sacrificial film 132 may include the first opening O1 exposing at least a portion of the top surface of the first insulating film 131. The first opening O1 may be formed by an etching process. The first sacrificial film 132 may be, for example, silicon nitride (SiN).

Figure 10:
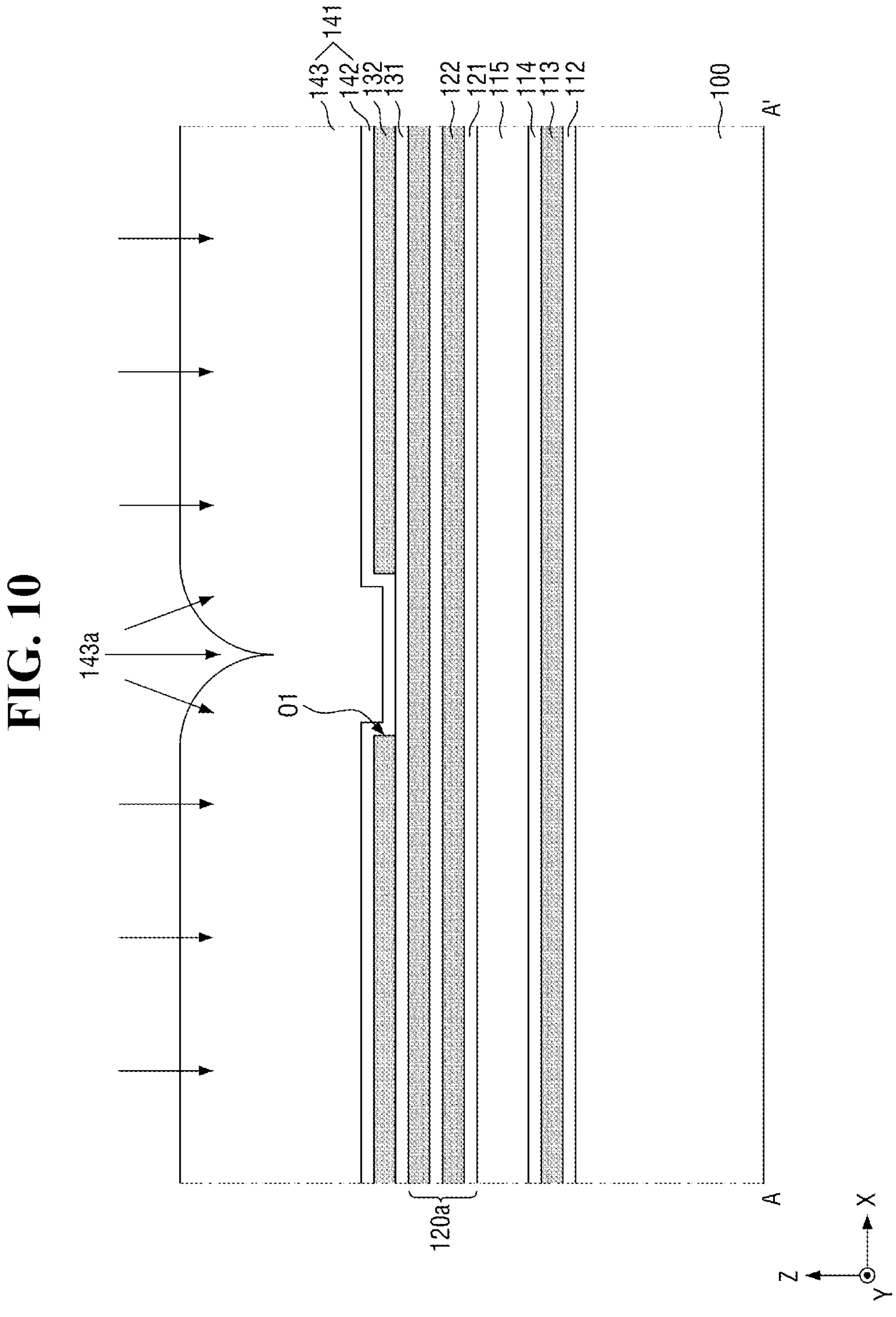

Referring to FIG. 10, the second insulating film 141 may be formed on the first sacrificial film 132. The second insulating film 141 may include the first interlayer insulating film 142 and the second interlayer insulating film 143.

The first interlayer insulating film 142 may be formed on the first sacrificial film 132. The first interlayer insulating film 142 may be conformally formed along the first sacrificial film 132 and the first opening O1. The first interlayer insulating film 142 may be formed, for example, on the first sacrificial film 132 to have substantially the same thickness. The term "same" as used herein may not only mean being completely identical but also include a minute difference that may occur due to a process margin and the like. The term "substantially" may be used herein to emphasize this meaning, unless the context or other statements indicate otherwise. For example, items described as "substantially the same" may be exactly the same or may be the same within acceptable variations that may occur, for example, due to manufacturing processes. The first interlayer insulating film 142 may be formed, for example, by an atomic layer deposition (ALD) process.

The second interlayer insulating film 143 may be formed on the first interlayer insulating film 142. The second interlayer insulating film 143 may include, for example, tetraethyl orthosilicate (TEOS), and may be formed by a chemical vapor deposition (CVD) process, plasma enhanced chemical vapor deposition (PECVD) process, or the like.

The second interlayer insulating film 143 may include a depression 143*a*. The depression 143*a* recessed toward the substrate 100 may be formed in the top surface of the second interlayer insulating film 143. The depression 143*a* may be a portion recessed into the second interlayer insulating film 143, toward the substrate 100. The depression 143*a* may have a pointed shape toward the substrate 100. The depression 143*a* may be formed above the first opening O1. The depression 143*a* may be formed, for example, at a central portion of the width of the first opening O1 in the first direction X.

Subsequently, a wet etching process may be performed on the second interlayer insulating film 143. For example, an etching solution used in the wet etching process may be a limulus amoebocyte lysate (LAL) solution and/or a buffer oxide etchant (BOE) solution for etching the oxide. The LAL solution is a mixture of deionized water, hydrogen fluoride (HF), and ammonium fluoride (NHF) and may be used to etch the oxide.

Alternatively, a dry etching process may be performed on the second interlayer insulating film 143. For example, the dry etching process may use a gas based on HF.

Figure 11:
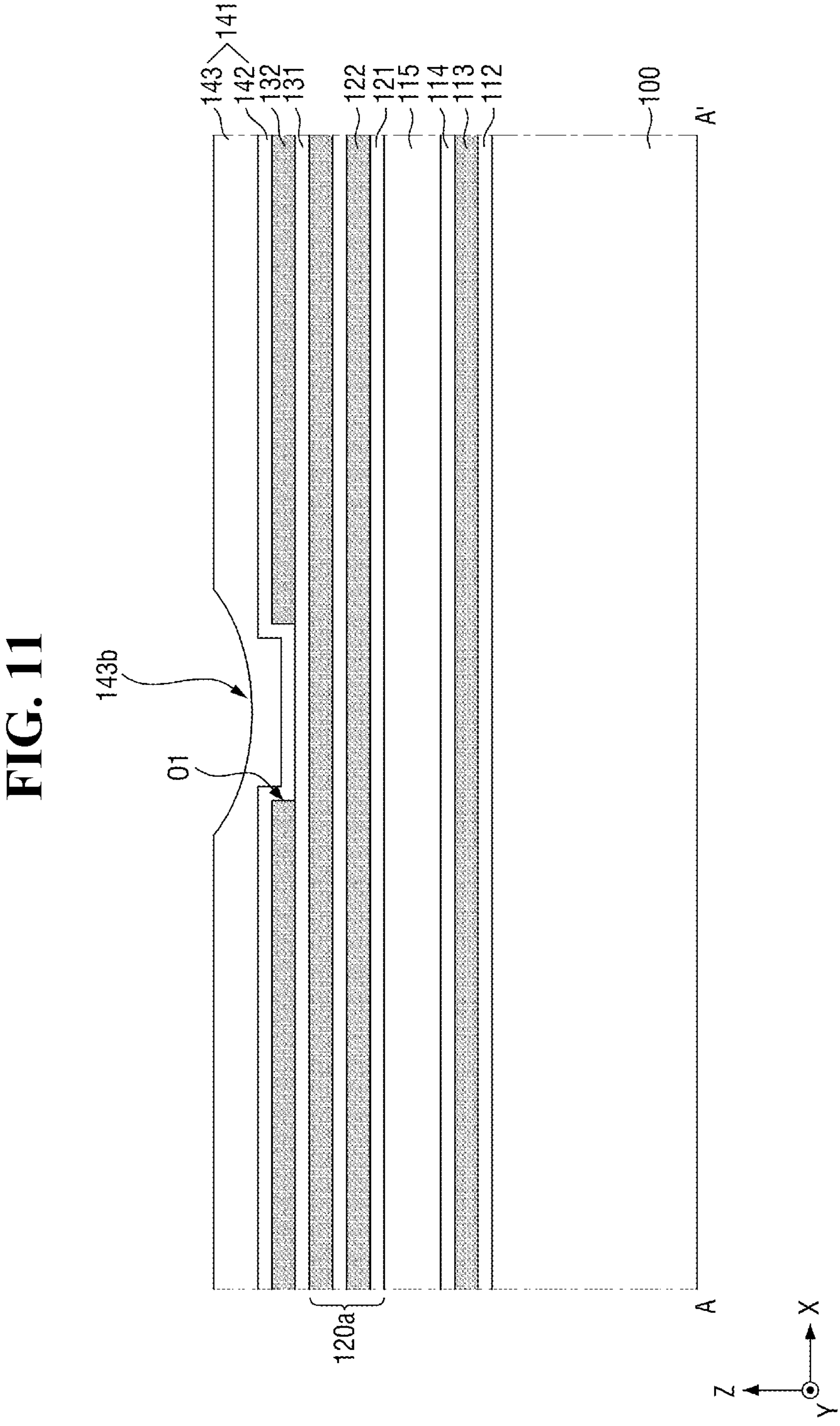

Referring to FIG. 11, the second interlayer insulating film 143 may be etched by the wet etching process. The second interlayer insulating film 143 may have a round portion 143*b* formed on its top surface by the wet etching process. The round portion 143*b* may be a convex portion or convex curve having an outward curve extending toward the substrate 100. The round portion 143*b* may include a portion where the depression 143*a* is etched. For example, the width of the round portion 143*b* in the first direction X may be greater than the width of the first opening O1 in the first direction X.

Figure 12:
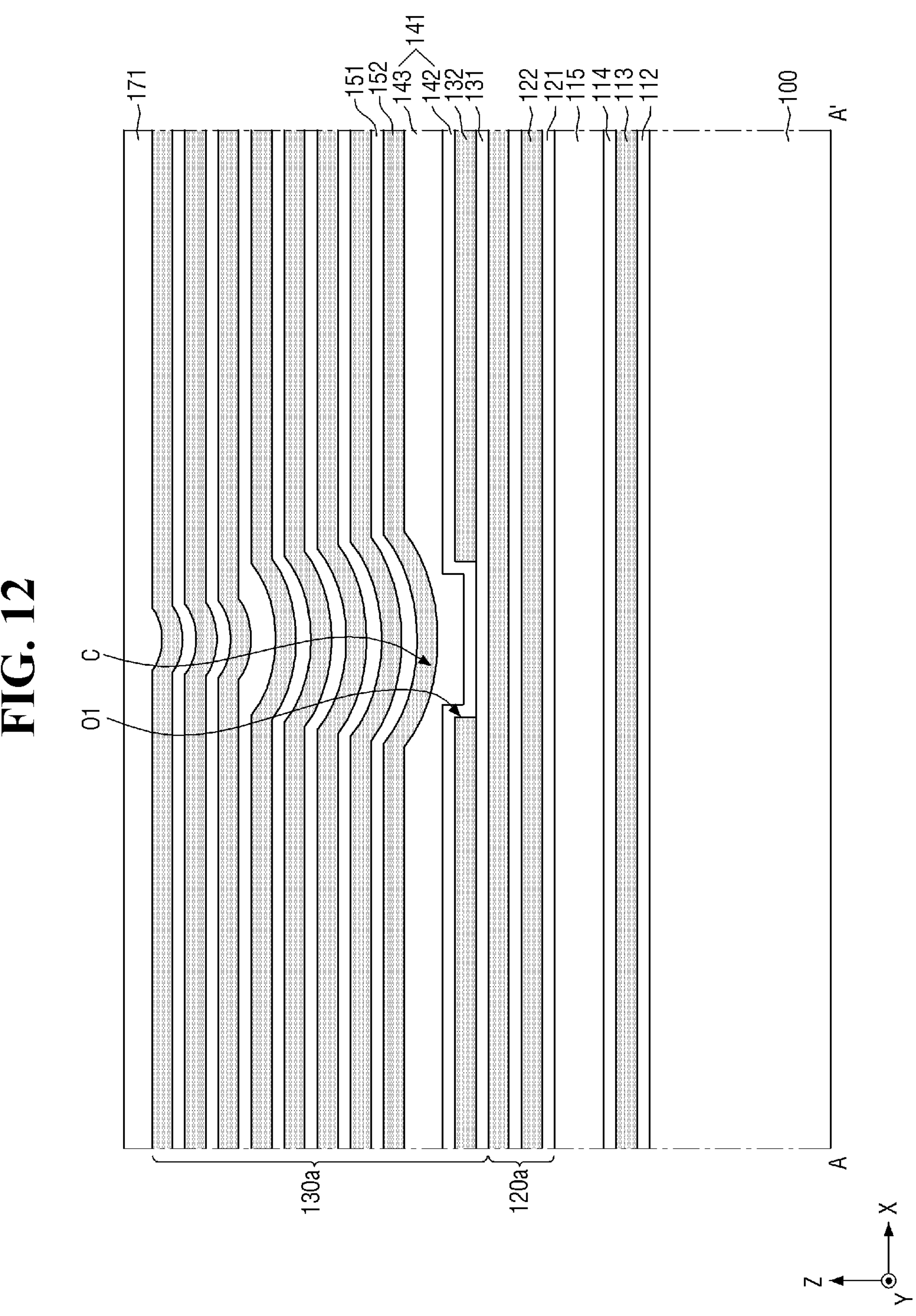

Referring to FIG. 12, a second sacrificial film 152 and the third insulating film 151 may be alternately stacked on the second interlayer insulating film 143 in the third direction Z. Accordingly, a second pre-stacked structure 130*a* including the first insulating film 131, the first sacrificial film 132, the second insulating film 141, the second sacrificial film 152, and the third insulating film 151, may be formed.

The third insulating film 151 and the second sacrificial film 152 may include a convex portion C due to the shape of the round portion 143*b*. The convex portion C may be formed on the round portion 143*b*. The convex portion C may be formed to have a smaller width as it goes away in the third direction Z from the top surface of the substrate 100. The convex portion C in the uppermost second sacrificial film of the second pre-stacked structure 130*a* may overlap the convex portion C in the lowermost second sacrificial film of the second pre-stacked structure 130*a* in the third direction Z. For example, the center of the convex portion C in the first direction X may coincide with the center of the first opening O1 in the first direction X. Further, unlike what is shown in FIG. 12, since the convex portion C has a smaller width in the first direction X as it goes along the third direction Z away from the top surface of the substrate 100, the uppermost convex portion C of the second pre-stacked structure 130*a* may have a substantially flat shape.

The fourth insulating film 171 may be formed on the second pre-stacked structure 130*a*.

Figure 13:
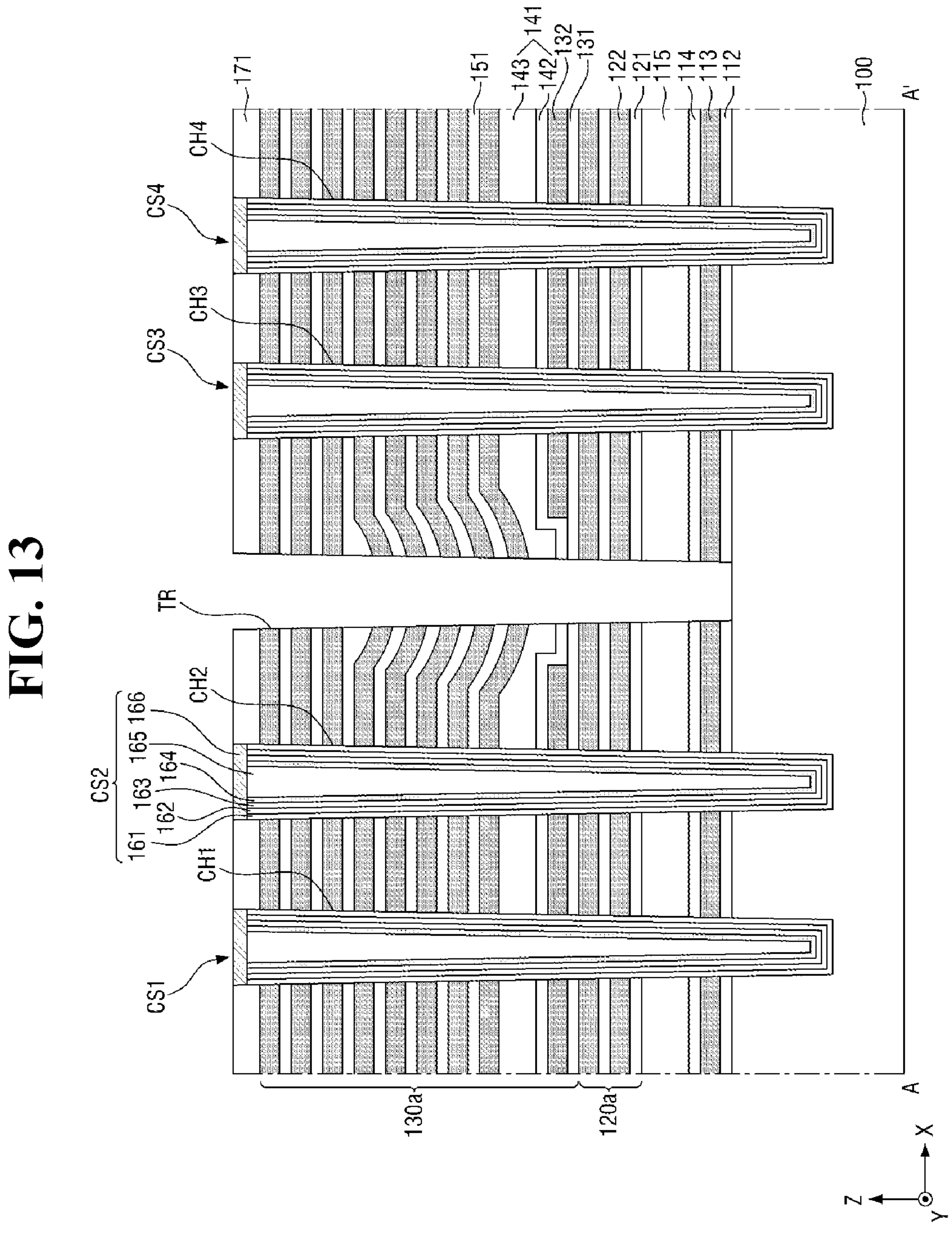

Referring to FIG. 13, the plurality of channel holes CH1 to CH4, which penetrate the fourth insulating film 171, the second pre-stacked structure 130*a*, the first pre-stacked structure 120*a*, the supporter film 115, the first to third films 112, 113, and 114, and the substrate 100, may be formed. For example, the plurality of channel holes CH1 to CH4 may extend in the third direction Z.

The plurality of channel holes CH1 to CH4 may be spaced apart from each other in the first direction X. The plurality of channel holes CH1 to CH4 may extend into the substrate 100.

In a semiconductor device according to some embodiments of the present disclosure, the plurality of channel holes CH1 to CH4 may not be formed on the convex portion C. That is, the plurality of channel holes CH1 to CH4 may be spaced apart from the convex portion C in the first direction X. For example, the plurality of channel holes CH1 to CH4 may be formed in a direction inclined in the first direction X with respect to the third direction Z. Also in this case, similarly, the plurality of channel holes CH1 to CH4 may not be formed on the convex portion C. That is, the plurality of channel holes CH1 to CH4 may not overlap the convex portion C.

For example, if the first channel hole CH1 is formed on the convex portion C to overlap the convex portion C, and the second channel hole CH2 is not formed on the convex portion C so that they do not overlap each other, the height of a transistor connected to the plurality of gate electrodes 124, 134, 144, and 154 and formed at the first channel hole CH1 may be different from the height of a transistor connected to the plurality of gate electrodes 124, 134, 144, and 154 and formed at the second channel hole CH2. Therefore, during a read/write operation of the nonvolatile memory device, the transistor formed at the first channel hole CH1 may perform a different operation from the transistor formed at the second channel hole CH2, which cause a defect in the nonvolatile memory device.

However, in the nonvolatile memory device according to the present disclosure, since the channel holes CH1 to CH4 are not formed on the convex portion C, the memory cells connected to each of the plurality of gate electrodes 124, 134, 144, and 154 may have the same shape. The transistors connected to the gate electrodes 124, 134, 144, and 154 of the same level may all be formed at the same height. Accordingly, the present disclosure can provide a nonvolatile memory device with improved reliability.

Subsequently, the blocking insulating film 161, the charge storage film 162, the tunnel insulating film 163, the channel film 164, the filling pattern 165, and the channel pad 166 may be formed in each of the plurality of channel holes CH1 to CH4.

Thereafter, the trench TR, which passes through the fourth insulating film 171, the second pre-stacked structure 130*a*, the first pre-stacked structure 120*a*, the supporter film 115, and the first to third films 112, 113, and 114, may be formed between the second channel hole CH2 and the third channel hole CH3. That is, the word line cutting region WLC defined by the trench TR may be formed.

The trench TR may extend through the first opening O1 and the convex portion C. For example, the trench TR may extend through the center of the first opening O1 and the convex portion C. The distance from one sidewall of the trench TR to one sidewall of the first opening O1 adjacent to the one sidewall of the trench TR may be the same as the distance from the other sidewall of the trench TR to the other sidewall of the first opening O1 adjacent to the other sidewall of the trench TR.

Figure 14:
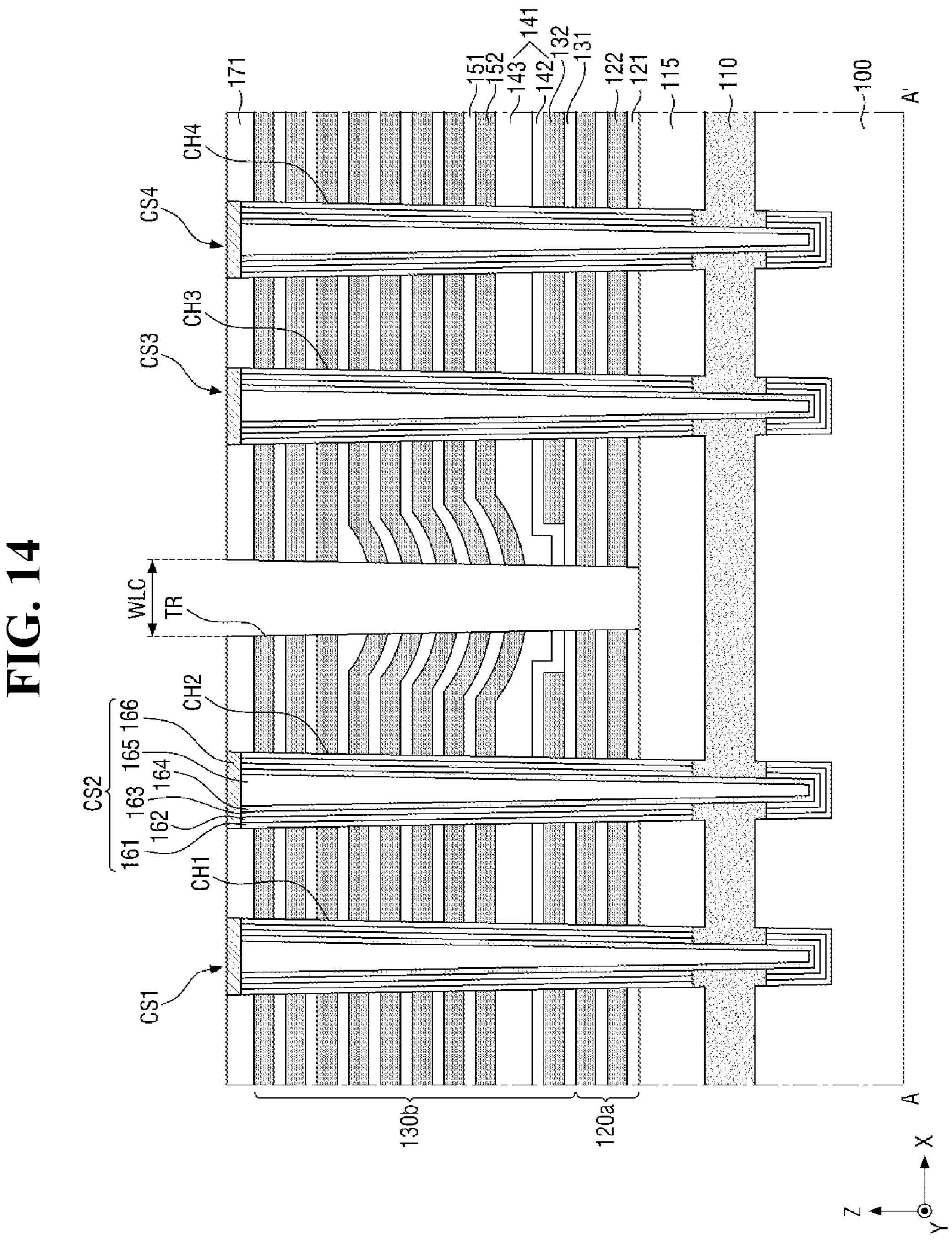

Referring to FIG. 14, the first film 112, the second film 113, and the third film 114 may be etched through the trench TR. At this time, a portion of the blocking insulating film 161, the charge storage film 162, and the tunnel insulating film 163 formed inside each of the first to fourth channel holes CH1 to CH4 may be etched. Due to this, a portion of the channel film 164 may be exposed through the etched regions of the first to third films 112, 113, and 114. In addition, the blocking insulating film 161, the charge storage film 162, and the tunnel insulating film 163 may be separated.

Subsequently, the common source plate 110 may be formed in the etched regions of the first to third films 112, 113, and 114, and in the etched regions of the blocking insulating film 161, the charge storage film 162, and the tunnel insulating film 163.

Figure 15:
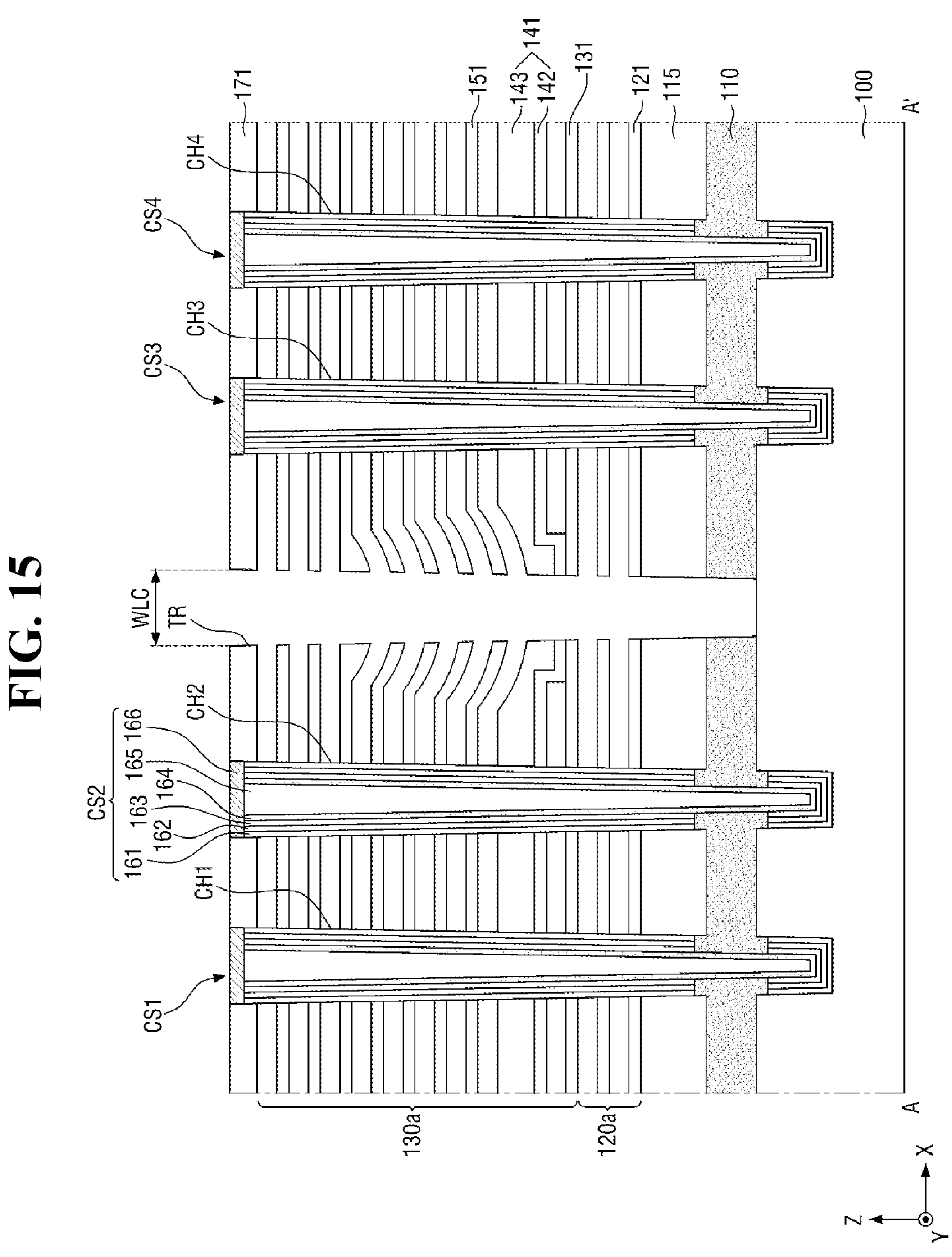

Referring to FIG. 15, the sub-sacrificial film 122, the first sacrificial film 132, and the second sacrificial film 152 may be removed by performing an etching process through the trench TR.

Figure 16:
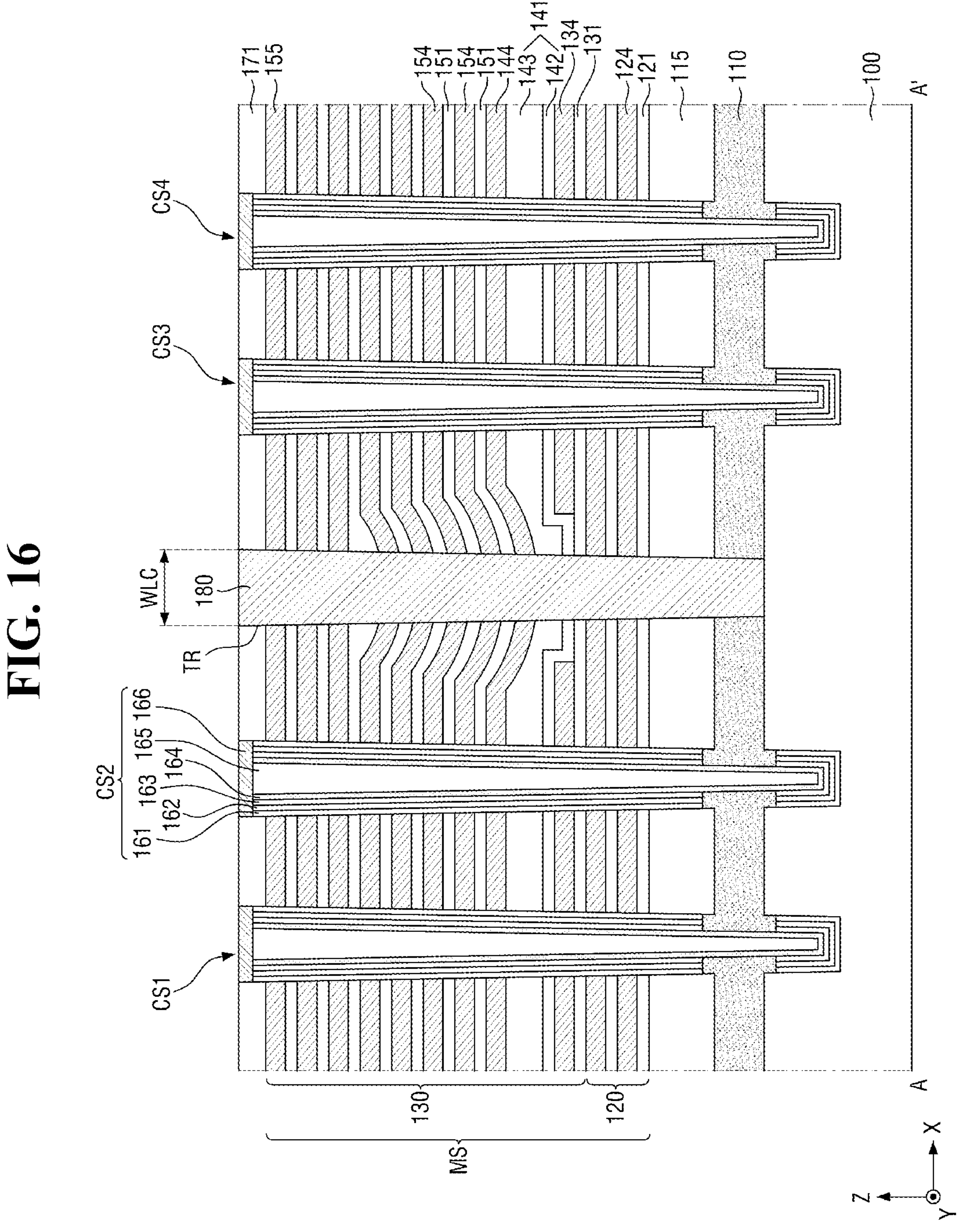

Referring to FIG. 16, the sub-gate electrode 124 and the first to fourth gate electrodes 134, 144, 154 and 155 may be formed in the regions where the sub-sacrificial film 122, the first sacrificial film 132 and the second sacrificial film 152 are removed. Therefore, the first stacked structure 120 in which the sub-insulating film 121 and the sub-gate electrode 124 are alternately stacked may be formed. In addition, the second stacked structure 130 in which the plurality of insulating films 131, 141, and 151 and the plurality of gate electrodes 134, 144, 154, and 155 are alternately stacked may be formed.

Next, the cutting structure 180 may be formed inside the trench TR.

Subsequently, the fifth insulating film 172, the bit line contact 173, and the bit line BL may be formed on the fourth insulating film 171. In this way, the nonvolatile memory device shown in FIG. 4 may be manufactured.

Figure 17:
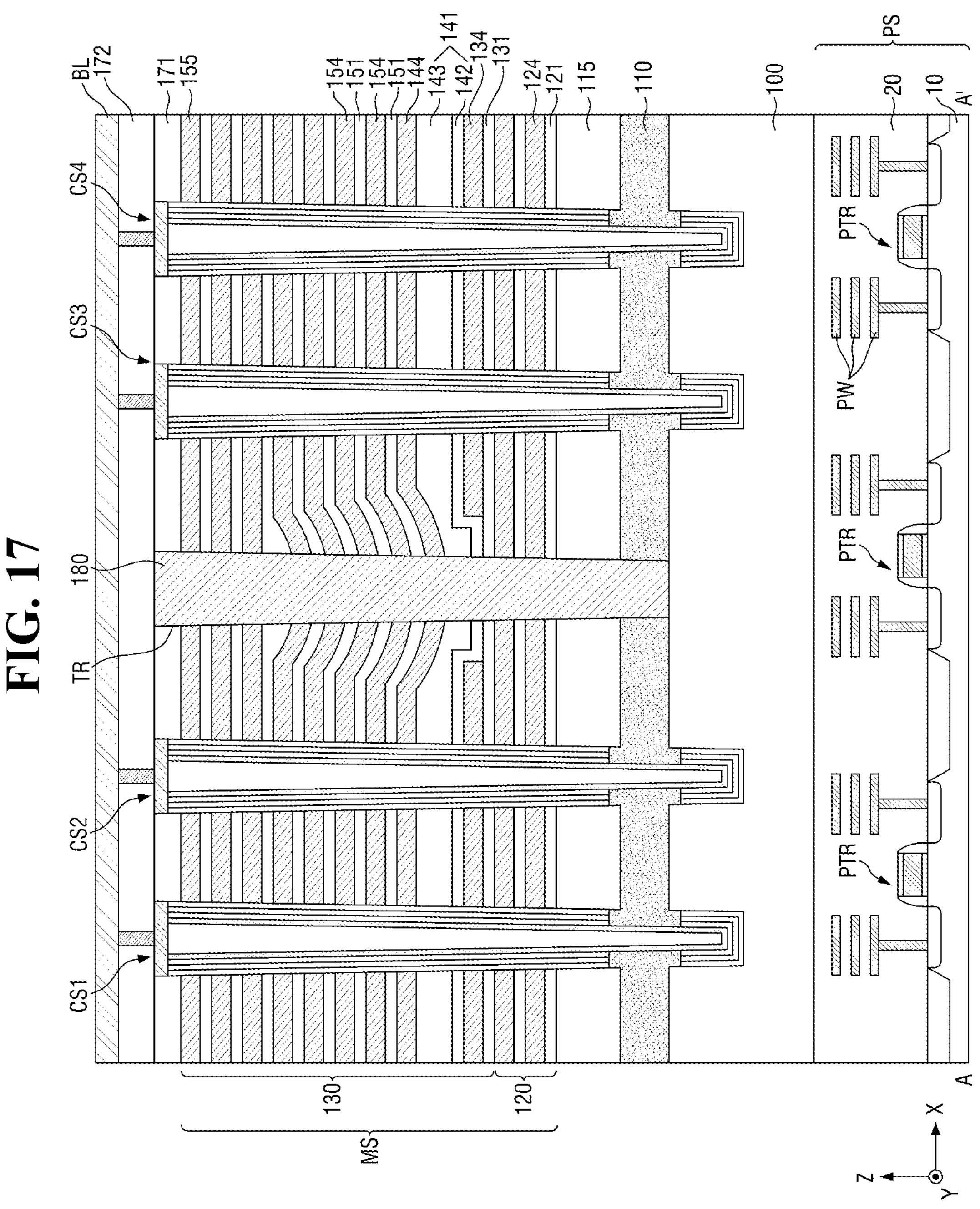
FIG. 17 illustrates a cross-sectional view taken along line A-A' of FIG. 3.

FIG. 17 is a cross-sectional view taken along line A-A' of FIG. 3.

Referring to FIG. 17, unlike FIG. 4, a nonvolatile memory device according to some other exemplary embodiments of the present disclosure may include a peripheral circuit structure PS under the substrate 100. The peripheral circuit structure PS may include a base substrate 10, a peripheral circuit insulating film 20, a peripheral circuit element PTR, and a wiring structure PW.

The base substrate 10 may be, for example, a semiconductor substrate such as a silicon substrate, a germanium substrate, or a silicon-germanium substrate. Alternatively, the base substrate 10 may be a silicon-on-insulator (SOI) substrate, a germanium-on-insulator (GOI) substrate, or the like.

The peripheral circuit insulating film 20 may be formed on the base substrate 10. The peripheral circuit insulating film 20 may be formed of, for example, at least one of silicon oxide, silicon nitride, silicon oxynitride, or a low dielectric constant material.

The peripheral circuit element PTR may be formed on the base substrate 10. The peripheral circuit element PTR may include, for example, a row decoder (33 in FIG. 1), a page buffer (35 in FIG. 1), a control logic (37 in FIG. 1), and the like.

The peripheral circuit element PTR may include, for example, not only various active elements such as transistors, but also various passive elements such as capacitors, resistors and inductors.

The wiring structure PW may be formed in the peripheral circuit insulating film 20. The wiring structure PW may be connected to the peripheral circuit element PTR. The wiring structure PW may be formed of, for example, metal (e.g., copper (Cu) or aluminum (Al)), but is not limited thereto.

In concluding the detailed description, those skilled in the art will appreciate that many variations and modifications can be made to the preferred embodiments without substantially departing from the principles of the present disclosure. Therefore, the disclosed preferred embodiments of the invention are used in a generic and descriptive sense only and not for purposes of limitation.

What is claimed is:

1. A nonvolatile memory device comprising:

a substrate including a cell array region and an extension region;

a plurality of gate electrodes stacked on the substrate, the plurality of gate electrodes comprising at least one first gate electrode and a plurality of second gate electrodes stacked on the at least one first gate electrode, the at least one first gate electrode including a first opening on the cell array region and a second opening on the extension region;

a word line cutting region cutting the plurality of gate electrodes and extending in a first direction that is parallel with an upper surface of the substrate; and a plurality of channel structures passing through the plurality of gate electrodes.

2. The nonvolatile memory device of claim 1, wherein at least a portion of the first opening overlaps the second opening in the first direction.

3. The nonvolatile memory device of claim 1, wherein at least a portion of the word line cutting region overlaps the first opening in the first direction.

4. The nonvolatile memory device of claim 1, wherein at least a portion of the word line cutting region overlaps the second opening in the first direction.

5. The nonvolatile memory device of claim 1, wherein the word line cutting region has a first width in a second direction intersecting with the first direction, wherein the first opening has a second width in the second direction, and wherein the first width is smaller than the second width.

6. The nonvolatile memory device of claim 1, wherein the plurality of channel structures are spaced apart from the first opening.

7. The nonvolatile memory device of claim 1, wherein the word line cutting region does not cut the plurality of channel structures.

8. The nonvolatile memory device of claim 1, wherein the word line cutting region is disposed at a center of the first opening.

9. The nonvolatile memory device of claim 1, wherein the at least one first gate electrode is a ground select line.

10. A nonvolatile memory device comprising:

a substrate;

at least one first gate electrode including an opening on the substrate;

a plurality of second gate electrodes stacked on the at least one first gate electrode and including convex portions having an outward curve extending toward the substrate;

a first channel structure passing through the at least one first gate electrode and the plurality of second gate electrodes; and a second channel structure passing through the at least one first gate electrode and the plurality of second gate electrodes and spaced apart from the first channel structure in a first direction, wherein the convex portions of the plurality of second gate electrodes and the opening of the at least one first gate electrode are formed between the first channel structure and the second channel structure.

11. The nonvolatile memory device of claim 10, wherein at least a portion of the convex portions of the plurality of second gate electrodes overlaps the opening of the at least one first gate electrode.

12. The nonvolatile memory device of claim 10, further comprising:

a plurality of third gate electrodes stacked on the substrate, the plurality of third gate electrodes being between the substrate and the at least one first gate electrode, wherein the plurality of third gate electrodes do not include convex portions.

13. The nonvolatile memory device of claim 10, further comprising:

a plurality of third gate electrodes stacked on the plurality of second gate electrodes, wherein the plurality of second gate electrodes are between the at least one first gate electrode and the plurality of third gate electrodes, and wherein the plurality of third gate electrodes do not include convex portions.

14. The nonvolatile memory device of claim 10, wherein the convex portion included in one of the plurality of second gate electrodes has a first width in the first direction, wherein the convex portion included in another of the plurality of second gate electrodes has a second width in the first direction, and wherein the first width is different from the second width.

15. The nonvolatile memory device of claim 10, wherein the opening has a first width in the first direction, wherein the convex portion included in one of the plurality of second gate electrodes, which is adjacent to the at least one first gate electrode, has a second width in the first direction, and wherein the first width is smaller than the second width.

16. The nonvolatile memory device of claim 10, further comprising:

a word line cutting region cutting the opening and the convex portions.

17. The nonvolatile memory device of claim 16, wherein the word line cutting region does not cut the first channel structure and the second channel structure.

18. A nonvolatile memory device comprising:

a substrate including a cell array region and an extension region;

a mold structure including a plurality of gate electrodes and a plurality of insulating films alternately stacked on the substrate; and a plurality of channel structures passing through the mold structure, wherein the plurality of gate electrodes includes at least one first gate electrode and a plurality of second gate electrodes stacked on the at least one first gate electrode, wherein the at least one first gate electrode includes a first opening on the cell array region and a second opening on the extension region, wherein one of the plurality of insulating films is between the at least one first gate electrode and one of the plurality of second gate electrodes adjacent to the at least one first gate electrode to fill the first opening and the second opening, and wherein at least a portion of the first opening overlaps the second opening in a first direction that is parallel with an upper surface of the substrate.

19. The nonvolatile memory device of claim 18, further comprising:

a source plate between the substrate and the mold structure, wherein each of the plurality of channel structures includes a channel film, and wherein the channel film is electrically connected to the source plate.

20. The nonvolatile memory device of claim 18, wherein the plurality of channel structures are not formed on the first opening and the second opening.

* * * * *